(12) United States Patent
Labonté et al.

(10) Patent No.: US 7,175,777 B1
(45) Date of Patent: Feb. 13, 2007

(54) METHOD OF FORMING A SUB-MICRON TIP FEATURE

(75) Inventors: André Paul Labonté, Lewiston, ME (US); Lee James Jacobson, Cape Elizabeth, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 515 days.

(21) Appl. No.: 10/726,122

(22) Filed: Dec. 2, 2003

(51) Int. Cl.
*G01L 21/30* (2006.01)

(52) U.S. Cl. .......................... 216/59; 216/26; 438/689; 438/700; 438/712; 438/713; 438/696; 438/706; 438/725; 430/302; 430/312; 430/313; 430/314

(58) Field of Classification Search ............... 216/59; 438/689; 430/302
See application file for complete search history.

(56) References Cited

U.S. PATENT DOCUMENTS

2004/0184703 A1* 9/2004 Bakir et al. ................... 385/14

* cited by examiner

*Primary Examiner*—Shamim Ahmed
*Assistant Examiner*—Maki Angadi
(74) *Attorney, Agent, or Firm*—Stallman & Pollock LLP

(57) ABSTRACT

A single, controlled etch step can be used to form a sharp tip feature along a sidewall of an etch feature. An etch process is used that is selective to a layer of tip material relative to the substrate upon which the layer is deposited. A lag can be created in the etch, such that the etch rate is slower near the sidewall. The sharp tip feature is formed from the same layer of material used to create the etch feature. The sharp tip feature can be used to decrease the minimum critical dimension of an etch process, such as may be due to the minimum resolution of a photolithographic process. The novel tip feature also can be used for other applications, such as to create a microaperture for a photosensitive device, or to create a micromold that can be used to form objects such as microlenses.

12 Claims, 4 Drawing Sheets

METHOD OF FORMING A SUB-MICRON TIP FEATURE

TECHNICAL FIELD OF THE INVENTION

The present invention utilizes varying etch rates in an etch process to generate an etch feature and a sub-micron tip feature using a single etch step.

DETAILED DESCRIPTION

Figure 1:
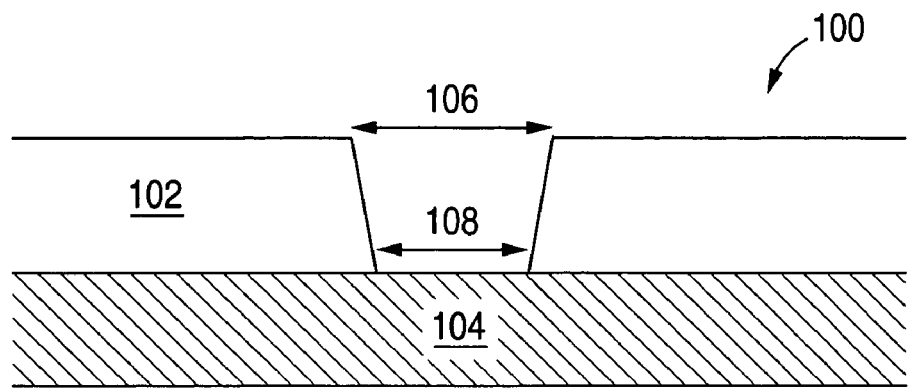
FIG. 1 is a cross-section of an etch feature of the prior art.

As performance requirements for various semiconductor devices increase, the need for higher density designs requires the creation of features having dimensions that extend down to the micron and submicron level. Many designs are limited by physical constraints, as minimum features sizes are constrained by current processing technology. For example, feature sizes can be limited by the resolution of a photolithography process, or the minimum feature size of a circuit design that is capable of being transferred to a photoresist mask. FIG. 1 shows such a configuration 100, where a layer 102 of material on a substrate 104 has been etched using a photoresist process to create an etch feature such as, for example, a sacrificial emitter opening. The width 106 at the top of the etch feature is essentially the same as the dimension of the feature in the corresponding photoresist mask, and is limited by the resolution of the photolithography process. The width 108 at the bottom of the feature is on the same order as width 106, but will differ to some extent due to the profile of the sidewall created during the etch process. Certain processes exist to slightly alter or control the profile of the sidewall, thereby determining the width 108 at the bottom of the feature. These processes, however, do not appreciably decrease the minimum feature size that can be created by photolithographic processes.

Figure 2:
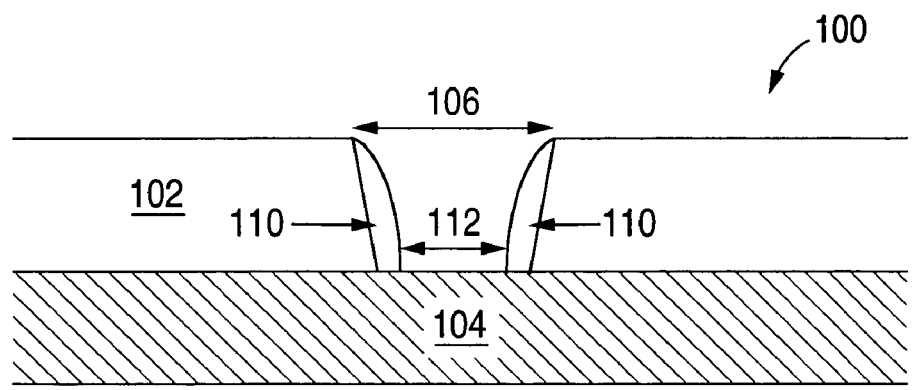
FIG. 2 is a cross-section showing the etch feature of FIG. 1 with spacers formed along the sidewalls in accordance with the prior art.

FIG. 2 shows the configuration 100 of FIG. 1, except that "spacers" have been added to the sidewalls of the etch feature. These traditional spacers 110 can be used to reduce the critical dimension 112 at the bottom of the etch feature, but require the deposition of a second film of material that is different than the material of the etch layer 102. A spacer is typically made by depositing a spacer material, such as an oxide or nitride, on the horizontal and vertical surfaces of an etch feature, then etching away the spacer material on the horizontal surface(s) to create vertical spacers of the appropriate thickness. The creation of these substantially vertical spacers not only requires extra process steps, and adds further complexity to an already complex process, but also leads to the formation of undesired spacer-like formations in any areas of non-planar topography that are exposed to the deposition of the spacer material. Undesired formations can lead to problems with effective dimensions elsewhere in the circuit pattern, and the presence of the spacer material often leads to undesired complexities related to RIE selectivity.

Figure 3A:
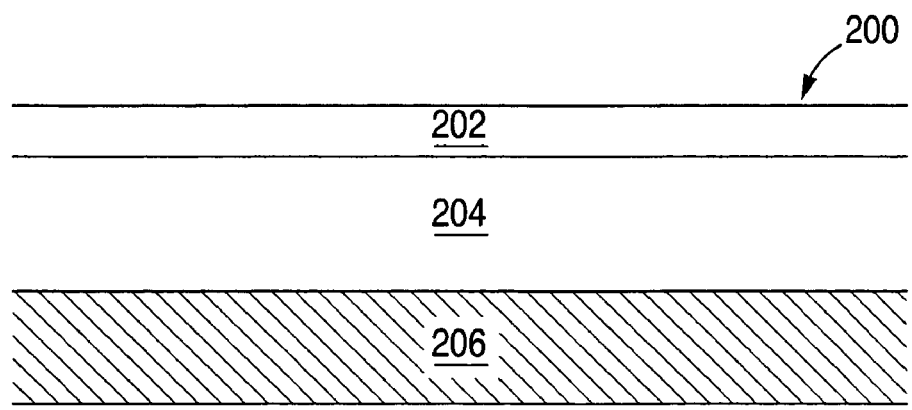
FIG. 3 is a cross-section showing a process in accordance with one embodiment of the present invention, showing stages (a) before the etch, (b) during the etch, and (c) after the etch.
Figure 3B:
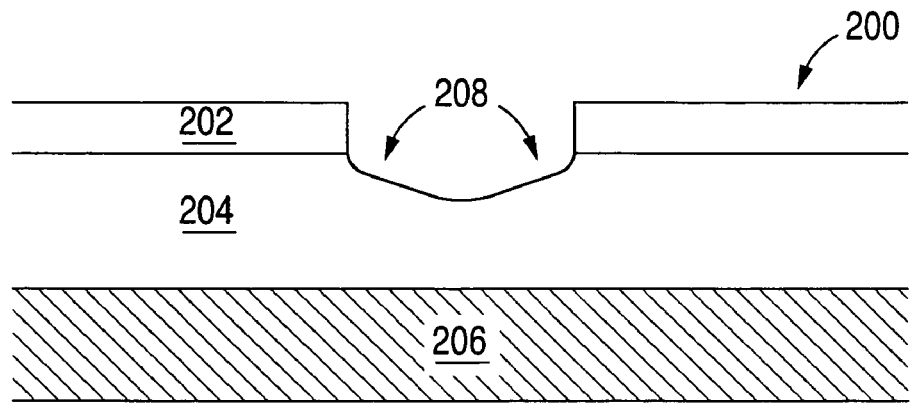
Figure 3C:
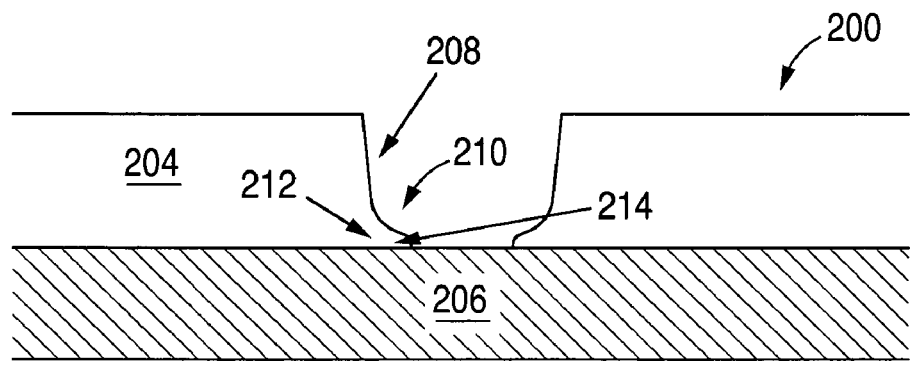

Systems and methods in accordance with various embodiments of the present invention can overcome these and other deficiencies in existing etch processes in order to significantly reduce the minimum dimension of features that can be created by such an etch process. A novel etch process can be used to create two distinct features from a single etch step. For example, FIG. 3 shows stages of an exemplary etch process that can be used to create a sharp, horizontal tip feature and a substantially vertical sidewall from a single etch step. FIG. 3(a) shows a material configuration 200 wherein a layer of tip material 204 resides on a substrate 206 of a different material. A mask layer 202 is deposited onto the layer of tip material 204, which can be removed after etch as shown in FIG. 3(c). This layered configuration can undergo an etching process, such as a single-step reactive ion etch (RIE), in order to etch a feature such as a pit into the layer of tip material 204. During the etch, substantially vertical sidewalls 208 begin to form in the pit as shown in FIG. 3(b). These sidewalls can be of any appropriate angle relative to the substrate layer, such as on the order of about 70° to about 90°. The terms "vertical" and "horizontal" are used for purposes of simplicity to imply orthogonal directionality, and should not be read as a limitation of the orientation of any device or process described herein.

If properly selected and controlled, a RIE process can have a much slower etch rate near a vertical edge of a material being etched than in a large horizontal area. Careful control of the etch can result in the formation of a sharp horizontal feature 210 as shown in FIG. 3(c). This feature 210 can have a base 212 along a substantially vertical sidewall 208 of the pit, and can have a tip point 214 or edge point opposite the base 212. Such a horizontal tip feature can have numerous potential uses in areas such as semiconductor, microscopic, and nanotechnology fabrication processes and technologies. The tip can be made of any of a number of appropriate materials, and can rest on a substrate of any of a number of different materials.

Figure 4:
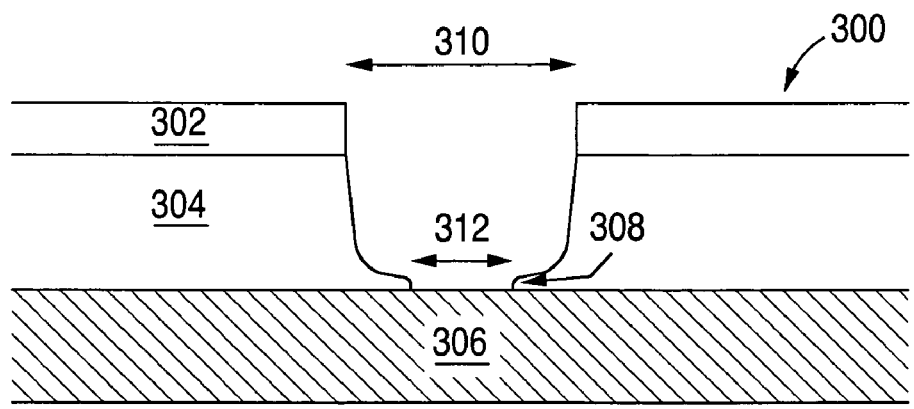
FIG. 4 is a cross-section showing the reduction of effective critical dimension spacing using a process in accordance with one embodiment of the present invention.

As discussed above, the use of such a process to create a tip feature can increase the effective resolution of a lithographic process. For example, FIG. 4 shows a configuration 300 having a layer of photoresist 302 over a layer of tip material 304 on a substrate 306. Existing photolithographic technology can only achieve certain minimum dimensions, as shown by the minimum separation 310 between portions of the photoresist layer 302. Using processes in accordance with embodiments of the present invention, the minimum effective feature size can be reduced by at least a factor of two relative to existing photolithographic techniques, such as down to on the order of ⅛ of a micron from about ¼ of a micron. As can be seen, the separation 312 between tips 308 is smaller than the minimum separation 310 of the photoresist that would otherwise be etched into the layer 304, but does not require any additional process steps to create. The critical dimension size can therefore be reduced without any additional time, energy, or expense using processes of the present invention.

The ability to manufacture such horizontal tip features arises from the fact that the etch of a film or layer in certain processes tends to go slower near an edge, such as an edge of a tip material layer located adjacent to an edge of a photoresist layer. A polymer buildup can occur near the resist sidewall during the etch, as is known in the art. Sidewall polymerization is typically used to control the profile, aspect ratio, or taper of a sidewall during etch. Processes in accordance with embodiments of the present invention can not only control the profile or taper of a vertical sidewall, but can also create a separate horizontal feature from the same etch step. The polymer buildup, if properly controlled, can cause the etch to not only proceed more slowly along the edge than elsewhere, but can also progress with a desired rate relative to the bulk etch such that a pre-determined etch lag is purposefully created. If the etch is halted in the appropriate location, or at the appropriate time, the etch will have cleared out the film or layer away from the edge, leaving a substantially vertical sidewall and a residual tip feature. The timing and precision of the process can be controlled using various process parameters, such as the rate of polymer generation and the etch chemistry.

While any appropriate etch technique can be used, it can be preferable in some embodiments to utilize a Reactive Ion Etch (RIE) process. The process parameters can include any appropriate parameters known in the art for the chemistry and materials of the etch process, as well as for the shape/size of the feature(s) to be created by the etch process. Etch process gases can include any appropriate process gases, such as but not limited to $O_2$, $CF_4$, $SF_6$, $CHF_3$, He, $N_2$, Ar, $Cl_2$, Ar, and $SiCl_4$. Etch rates will vary depending on the gases and material(s) being etched, but often are in the range of from tens of nanometers to microns per minute. The pressure in an etch chamber can be any appropriate pressure, including but not limited to pressures on the order of 50 mTorr to 100 mTorr, or on the order of 0 mTorr to about 1000 mTorr, for example. The power setting for an RF supply can be any appropriate setting, including but not limited to powers on the order of about 100 W to about 600 W, or on the order of about 50 W to about 1500 W. Once the process gases, materials, and feature sizes have been determined, the process parameters can be adjusted to appropriately set the etch progression in the bulk and along the sidewalls.

In certain embodiments, it is necessary to properly end the etch process. While numerous ways exist to determine when to end the etch, two relatively simple examples include timing and endpoint approaches. In a timing approach, knowing the etch rate and thickness of the tip material, as well as the desired tip feature size, can allow for a determination of the length of time necessary to expose the tip material to the etch. The etch process can then be stopped after the determined period of time passes. In a second exemplary approach, which can be less dependent upon process variation in some embodiments, an endpoint can be utilized to properly end the etch. After the etch process reaches the substrate, a signal can be generated to measure the width of the open area in the tip material and/or the position of the receding edge of the tip material during the etch. The etch process can be stopped once the etch, or the edge of the tip material, reaches the desired tip position. It may be necessary to stop the etch process slightly before the etch reaches the desired position, in order to avoid inadvertent overetch.

Figure 5A:
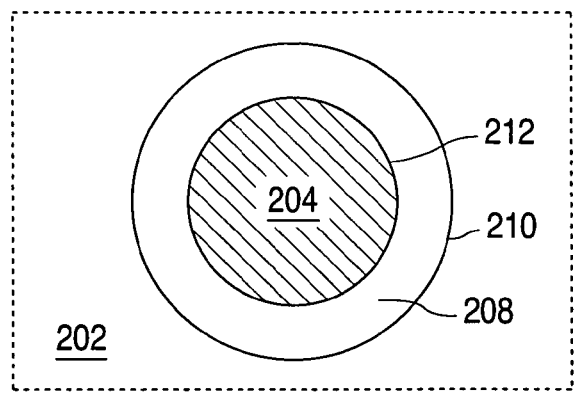
FIG. 5 is a top view of features made using the process of FIG. 3, including a (a) round feature or pit, (b) an edge feature, and (c) a narrow tip feature.
Figure 5B:
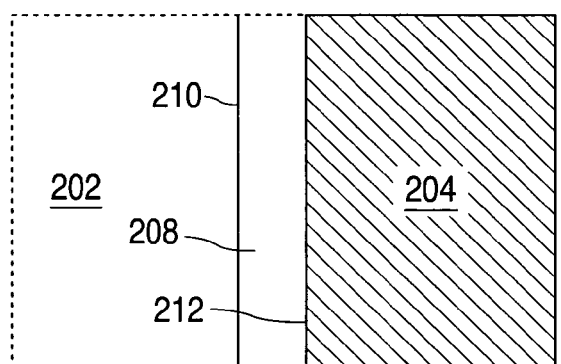
Figure 5C:
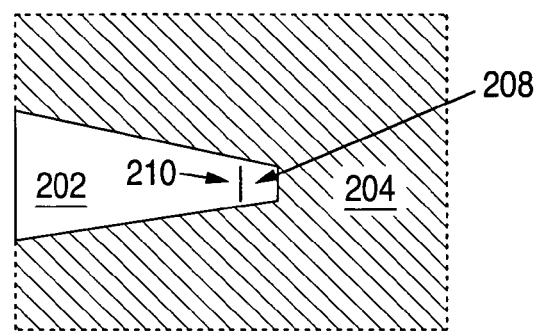

Horizontal tip features can be formed in any of a number of geometries, as shown for example in FIG. 5(a)–5(c). For simplicity, reference numbers are carried over from FIG. 3 where appropriate. In FIG. 5(a), a circular pit is etched into the tip material layer 206, the pit having a ring-shaped horizontal tip feature 208 about the area of exposed substrate 204. FIG. 5(b) shows a horizontal tip feature 208 running along a substantially straight vertical edge of the tip layer 202. FIG. 5(c) shows a horizontal tip feature 208 at the end of a narrow, shaped layer of tip material 202, the tip feature being positioned over the substrate material 204.

The tip material used in the above examples can be any appropriate material, such as for example a nitride material, such as silicon nitride, or polysilicon. The substrate material can be any appropriate material, different than that of the tip material, such as for example single crystal silicon or polysilicon. The layer thickness of the tip material and substrate can be any appropriate thickness, except that the thickness of the tip material layer is preferably at least as great as the desired height of the horizontal tip feature at the base of the tip. The height and length of the tip can be dependent upon the process parameters and materials used, but in some embodiments are on the order of about 1.0 microns. The ratio of tip height to tip length can vary, and can be controlled or determined by the parameters of the etch process. Depending upon the precision and controllability of the etch process and the materials selected, tips with dimensions less than one micron can also be formed.

The etch process used, such as a reactive ion etch (RIE) process, should be selective to the tip material relative to the substrate. The etch can have additional etch steps in some embodiments, although only one etch step is necessary in most embodiments. Any etch process having an appropriate chemistry can be selected, as long as the etch process exhibits a lag, or lower etch rate, near a sidewall or substantially vertical feature. The etch process should be terminated at the appropriate point in the etch, prior to completion of a high-aspect ratio feature and/or a clearing of the tip material. Such a process can also be used on materials such as thin films to form extremely sharp features.

Figure 6:
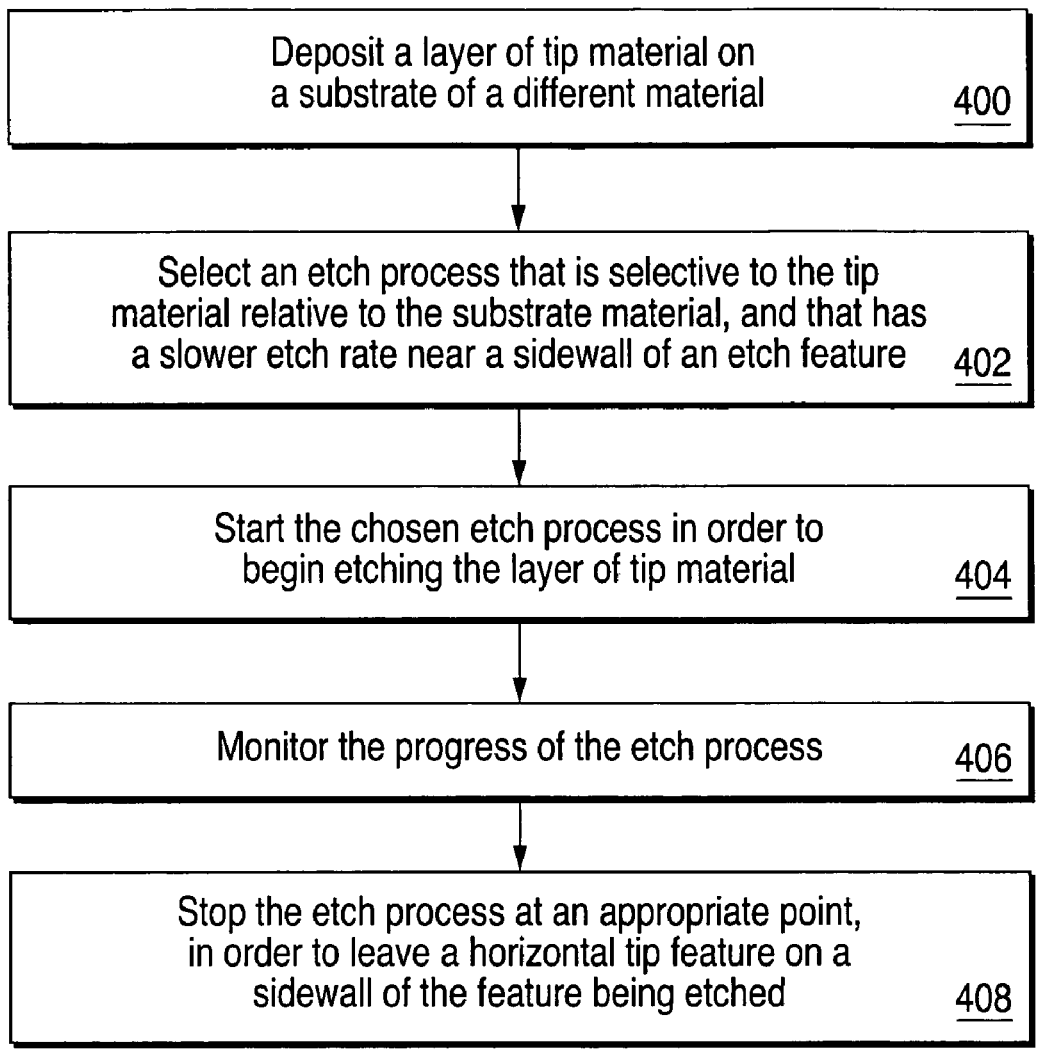
FIG. 6 is a flowchart showing a process in accordance with one embodiment of the present invention.

FIG. 6 shows steps of an exemplary process that can be used in accordance with embodiments of the present invention. In the process, a layer of tip material is deposited on a substrate of a different material 400. An etch process, such as an RIE process, is chosen that is selective to the tip material relative to the substrate material, and that has a slower etch rate near a sidewall of an etch feature 402. The chosen etch process is started in order to begin etching the layer of tip material 404. The progress of the etch process is monitored, either automatically, such as by a process monitor, or manually, such as by a process operator 406. The etch process is stopped at the appropriate point before completion, in order to leave a horizontal tip feature on a sidewall of the feature being etched 408.

Figure 7:
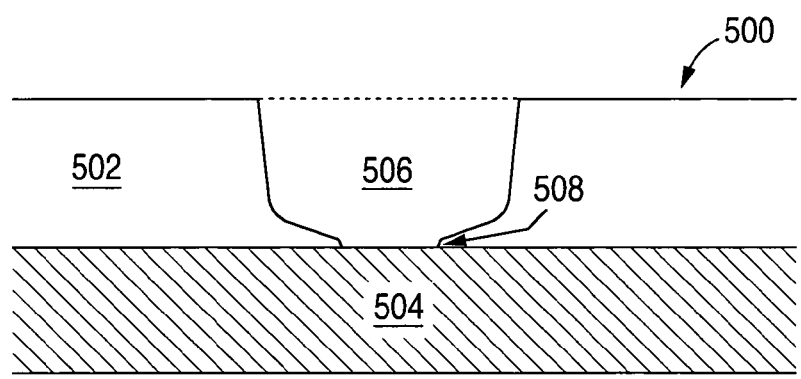
FIG. 7 is a cross-section view of a lens formed using a feature such as that shown in FIG. 3(c).

As shown in FIG. 7, sharp horizontal features in a tip material layer 502 can be used in a layer configuration 500 to shape an object such as a microscale lens, for example, by generating an appropriately shaped form or mold. As shown in the cross-section of FIG. 7, lens material 506 such as a plastic or polymer can be deposited into the void created by the etch process. The shape of the tip 508 can be controlled in order to impart the appropriate curvature unto the lens material 506. Shaping a lens in this manner can provide more options when creating a lens to, for example, focus light for the purpose of blowing a fuse in a circuit. A lens can also be shaped for semiconductor optical sensors, which typically require particularly and precisely shaped microlenses. While dome-shaped lenses can be made relatively easy, upside-down shaped domes can be significantly more difficult to form. Processes in accordance with certain embodiments of the present invention allow upside-down shaped domes to be formed by filling an etch pit with an appropriate lens material after etch and allowing the lens material to cool and/or solidify.

Figure 8:
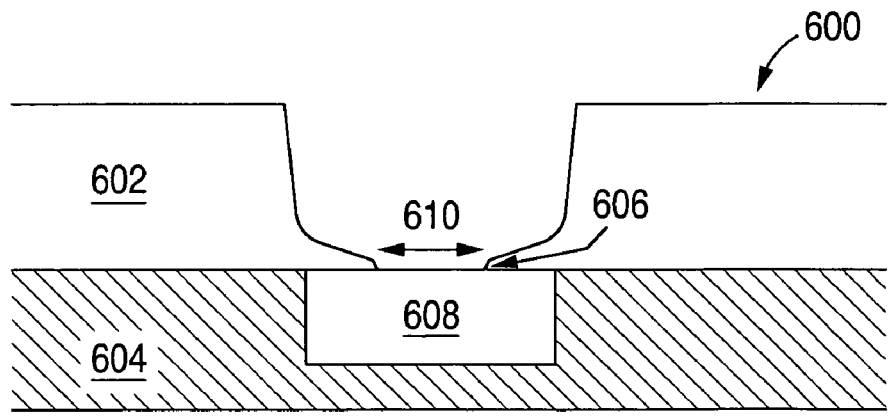
FIG. 8 is a cross-section showing an aperture for a photo-sensitive device, the aperture being formed in accordance with an embodiment of the present invention.

FIG. 8 shows an exemplary configuration 600, wherein an aperture of an appropriate dimension 610 is created between tips 606 formed from the tip material layer 602 over the substrate. A photo-active or photo-sensitive device 608 can be embedded in the substrate before etching, placed in the substrate after the etch, or positioned in place of the substrate after etch, adjacent the opening formed between the tips 606. The opening can then serve as a micro-aperture for the photo-sensitive device 608.

It should be recognized that a number of variations of the above-identified embodiments will be obvious to one of ordinary skill in the art in view of the foregoing description. Accordingly, the invention is not to be limited by those specific embodiments and methods of the present invention shown and described herein. Rather, the scope of the invention is to be defined by the following claims and their equivalents.

What is claimed is:

1. A method of creating a horizontal tip feature in a layer of tip material, comprising:
    using an etch process to create an etch feature in the layer of tip material, the etch feature having horizontal areas and a substantially vertical sidewall, and the etch process having a slower etch rate near the substantially vertical sidewall than near the horizontal area; and
    stopping the etch process in order to form a portion of the substantially vertical sidewall and a horizontal tip feature adjacent to the portion of the substantially vertical sidewall.

2. A method according to claim 1, further comprising:
monitoring the progress of the etch process.

3. A method according to claim 1, further comprising:
depositing the layer of tip material on a substrate material, the substrate material being different than the tip material.

4. A method according to claim 3, further comprising:
selecting an etch process that is selective to the tip material relative to the substrate material.

5. A method according to claim 1, further comprising:
varying a rate of polymer generation in order to control the slower etch rate of the etch process.

6. A method according to claim 1, further comprising:
determining the size of the horizontal tip feature to be created before using the etch process.

7. A method according to claim 1, further comprising:
controlling the profile of the substantially vertical sidewall.

8. A method according to claim 1, further comprising:
filling the etch feature with a lens material in order to form a lens having a shape determined by the shape of the etch feature.

9. A method according to claim 1, further comprising:
positioning a photo-sensitive device adjacent the layer of tip material such that the horizontal tip feature serves as an aperture for the photosensitive device.

10. A method according to claim 1, further comprising:
placing a photoresist mask over the layer of tip material, the photoresist mask acting as a mask for the etch process.

11. A method according to claim 10, wherein:
stopping the etch process causes the etch feature to have a critical dimension due to the horizontal tip feature that is less than the minimum dimension of the photoresist mask.

12. A method according to claim 1, wherein:
using an etch process includes using a reactive ion etch process.

* * * * *